(12) United States Patent
Zheng et al.

(10) Patent No.: US 10,469,937 B2
(45) Date of Patent: Nov. 5, 2019

(54) VOLUME ADJUSTMENT METHOD, STORAGE MEDIUM AND MOBILE TERMINAL

(71) Applicant: GUANGDONG OPPO MOBILE TELECOMMUNICATIONS CORP., LTD., Dongguan, Guangdong (CN)

(72) Inventors: Zhiyong Zheng, Dongguan (CN); Hai Yang, Dongguan (CN); Zhaoan Xu, Dongguan (CN); Gaoting Gan, Dongguan (CN); Fenggui Yan, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 16/040,274

(22) Filed: Jul. 19, 2018

(65) Prior Publication Data

US 2019/0058940 A1    Feb. 21, 2019

(30) Foreign Application Priority Data

Aug. 18, 2017    (CN) .......................... 2017 1 0710424

(51) Int. Cl.
*H04R 1/22* (2006.01)
*G06F 3/16* (2006.01)
(Continued)

(52) U.S. Cl.
CPC .............. *H04R 1/225* (2013.01); *G01P 15/02* (2013.01); *G06F 3/165* (2013.01); *H03G 3/3005* (2013.01);
(Continued)

(58) Field of Classification Search
CPC ...... H04R 1/225; H04R 3/00; H04R 2430/01; G01P 15/02; G06F 3/165; H04M 1/6016; H03G 3/3005
(Continued)

(56) References Cited

U.S. PATENT DOCUMENTS

2015/0135078 A1 *    5/2015  Erkkila ................... G06F 1/163
                                                             715/727
2015/0234633 A1      8/2015  Wang et al.
(Continued)

FOREIGN PATENT DOCUMENTS

CN          101686276 A        3/2010
CN          104867506 A        8/2015
(Continued)

OTHER PUBLICATIONS

International Search Report in International application No. PCT/CN2018/097822, dated Oct. 17, 2018.
(Continued)

*Primary Examiner* — Paul Kim
*Assistant Examiner* — Friedrich Fahnert
(74) *Attorney, Agent, or Firm* — Ladas & Parry LLP

(57) ABSTRACT

Embodiments of the disclosure provides a volume adjustment method, a storage medium and a mobile terminal. In the method, physical exercise information of a user is acquired. It is determined whether a mobile terminal meets a preset volume adjustment condition according to the physical exercise information. When the mobile terminal meets the preset volume adjustment condition, a volume adjustment level corresponding to the physical exercise information is determined. A volume of the mobile terminal is adjusted according to the volume adjustment level.

14 Claims, 4 Drawing Sheets

(51) Int. Cl.
*H03G 3/30* (2006.01)
*G01P 15/02* (2013.01)
*H04M 1/60* (2006.01)
*H04R 3/00* (2006.01)

(52) U.S. Cl.
CPC ............ *H04M 1/6016* (2013.01); *H04R 3/00* (2013.01); *H04R 2430/01* (2013.01)

(58) Field of Classification Search
USPC .......................................................... 381/104
See application file for complete search history.

(56) References Cited

U.S. PATENT DOCUMENTS

| | | | |
|---|---|---|---|
| 2017/0017462 A1 | 1/2017 | Kubiak et al. | |
| 2017/0136296 A1* | 5/2017 | Barrera | G09B 19/003 |

FOREIGN PATENT DOCUMENTS

| | | |
|---|---|---|
| CN | 105324937 A | 2/2016 |
| CN | 105430184 A | 3/2016 |
| CN | 106095378 A | 11/2016 |
| CN | 106254541 A | 12/2016 |
| CN | 106331294 A | 1/2017 |
| CN | 106571153 A | 4/2017 |
| CN | 107005764 A | 8/2017 |
| CN | 107526569 A | 12/2017 |
| WO | 2015154814 A1 | 10/2015 |

OTHER PUBLICATIONS

Written Opinion of the International Search Authority in International application No. PCT/CN2018/097822, dated Oct. 17, 2018.
Supplementary European Search Report in European application No. 18184105.7, dated Dec. 17, 2018.

* cited by examiner

VOLUME ADJUSTMENT METHOD, STORAGE MEDIUM AND MOBILE TERMINAL

CROSS-REFERENCE TO RELATED APPLICATIONS

This application claims priority to Chinese Patent Application No. 201710710424.0 filed on Aug. 18, 2017, the disclosure of which is incorporated by reference herein in its entirety.

TECHNICAL FIELD

Embodiments of the disclosure relates to the field of computers, and in particular, to a volume adjustment method, a storage medium and a mobile terminal.

BACKGROUND

Currently, the functions of mobile terminals become increasingly abundant and increasingly intelligent, and various audio player applications (such as music player applications and audiobook reading applications, etc.) emerge. During using mobile terminals by users, there is a need to adjust the volume of mobile terminals depending on the various requirements of the users. However, the existing volume adjustment methods have drawbacks and need an improvement.

SUMMARY

At a first aspect, embodiments of the disclosure provide a volume adjustment method. The method includes the following operations: acquiring physical exercise information of a user, and determining whether the mobile terminal meets a preset volume adjustment condition according to the physical exercise information; determining a volume adjustment level corresponding to the physical exercise information, when the mobile terminal meets the preset volume adjustment condition; adjusting a volume of the mobile terminal according to the volume adjustment level.

At a second aspect, embodiments of the disclosure provide a non-transitory computer-readable storage medium, storing a computer program, which, when executed by a processor, implements the volume adjustment method as described at the first aspect.

At a third aspect, embodiments of the disclosure provide a mobile terminal. The mobile terminal includes a memory storing a computer program, and a processor, the computer program, when executed by the processor, implements the volume adjustment method as described at the first aspect.

DETAILED DESCRIPTION

Figure 1:
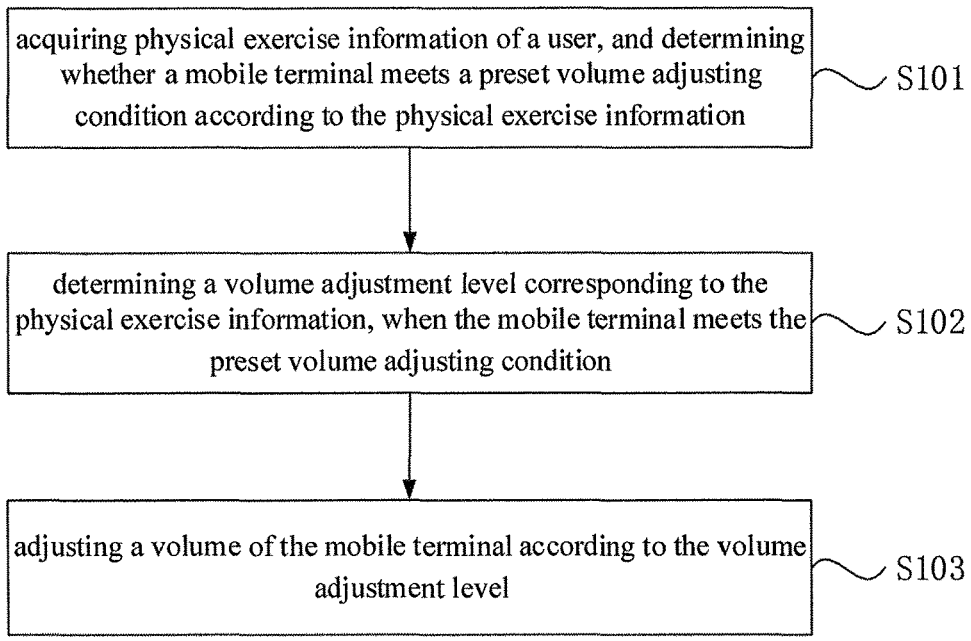
FIG. 1 illustrates a flow chart of a volume adjustment method according to some embodiments of the disclosure.

Solutions of the disclosure will be further described below by means of detailed embodiments in combination with the appended figures. It is to be understood that the detailed embodiments described herein are purely illustrative of the disclosure, and are not to limit the disclosure. Moreover, it is to be noted that for the convenience of description, only the portions relevant to the disclosure other than the whole structure are illustrated in the figures.

Before the more detailed discussion of the exemplary embodiments, it is to be noted that, certain embodiments are described as processes or method in the form of flow diagrams. Although the flow diagrams describe acts as sequential process, many of the acts can be performed in parallel, concurrently or simultaneously. Moreover, the sequence of the acts can be rearranged. When operations of the acts come to an end, the processes can be terminated or can still comprise additional acts not illustrated in the figures. The processes may correspond to methods, functions, procedures, subroutines, subprograms, etc.

Embodiments of the disclosure provides a volume adjustment method, a storage medium and a mobile terminal, which can optimize the volume adjustment approaches of mobile terminals.

In an embodiment, a volume adjustment method is provided, the method can be executed by a mobile terminal and includes operations of acquiring physical exercise information of a user; determining whether the mobile terminal meets a preset volume adjustment condition according to the physical exercise information; determining a volume adjustment level corresponding to the physical exercise information, when the mobile terminal meets the preset volume adjustment condition; and adjusting a volume of the mobile terminal according to the volume adjustment level.

In an embodiment, the method may further include operations of determining a frequency adjustment level corresponding to the physical exercise information; and adjusting frequency of a sound being played by the mobile terminal according to the frequency adjustment level; or switching from the sound being played to a piece of music, of which beats are at a speed matched with the frequency adjustment level.

In an embodiment, the physical exercise information may include at least one of the following: physical exercise intensity, physical exercise duration, movement speed or frequency, or estimated energy consumed by physical exercise.

In an embodiment, the operation of acquiring physical exercise information of a user may include at least one of the following: acquiring the physical exercise information of the user by means of one or more acceleration sensors in at least one of the mobile terminal or an external device connected to the mobile terminal; acquiring the physical exercise information of the user by means of positioning data from at least one of the mobile terminal or the external device connected to the mobile terminal; or acquiring biometric information of the user by means of at least one of the mobile terminal or the external device connected to the mobile terminal, and determining the physical exercise information of the user according to the biometric information.

In an embodiment, the operation of adjusting a volume of the mobile terminal according to the volume adjustment level may include adjusting the volume of the mobile terminal according to the volume adjustment level in a linear or non-linear manner.

In an embodiment, the operation of adjusting the volume of the mobile terminal according to the volume adjustment level in a linear or non-linear manner may include: acquiring a difference between the volume adjustment level and a current volume level of the mobile terminal; adjusting the volume in the linear manner, when the difference is less than a preset level difference; and adjusting the volume in the non-linear manner, when the difference is no less than the preset level difference.

In some embodiments, a non-transitory computer-readable storage medium is provided. The non-transitory computer-readable storage medium stores a computer program, which, when executed by a processor, implements the volume adjustment method as described above.

In some embodiments, a mobile terminal is provided. The mobile terminal includes a memory storing a computer program, and a processor, the computer program, when executed by the processor, implements the volume adjustment method as described above.

FIG. 1 illustrates a flow chart of a volume adjustment method according to some embodiments of the disclosure. The method can be performed by a volume adjustment device, the device can be implemented as software and/or hardware, and generally, the device can be integrated in a mobile terminal. As illustrated in FIG. 1, the method may include the following operations in blocks illustrated in FIG. 1. The method may begin from block S101.

At block S101, physical exercise information of a user is acquired, and it is determined whether the mobile terminal meets the preset volume adjustment condition according to the physical exercise information.

The physical exercise information of the user may be information indicating a physical exercise state of the user. The physical exercise state of the user may include a moving state and a still state. The moving state may include a uniform moving state and a non-uniform moving state. In the moving state, the movement speed may be represented by a movement velocity.

The physical exercise information can be acquired by acquiring movement frequency of the mobile terminal with an acceleration sensor built in the mobile terminal. For example, when the user walks or runs with the mobile terminal handheld or carried, a change of acceleration takes place along with every swing of the arm of the user, and thus the movement frequency of the user can be determined according to a periodical change of the acceleration of the mobile terminal, thereby determining the physical exercise state of the user. Meanwhile, a change of a position of the user can be acquired by using a positioning function of the mobile terminal, and the physical exercise state of the user can be determined according to the change of the position of the user. The abovementioned two approaches can be assumed alone or in combination with each other, or can be assumed in combination with other approaches of acquiring physical exercise information of the user. The combination will make the acquired result more accurate and avoid misjudgment on the physical exercise information of the user.

Regarding determining whether the mobile terminal meets the preset volume adjustment condition according to the physical exercise information, the preset volume adjustment condition may be one or any combination of the following: physical exercise intensity, physical exercise duration, movement speed or movement frequency, or estimated energy consumed by physical exercise.

For example, if a user is doing physical exercise on a treadmill, it may be determined whether the mobile terminal meets the preset volume adjustment condition according to the movement frequency of the user. The preset volume adjustment condition may be a frequency threshold. During the physical exercise of the user, if the frequency acquired by the mobile terminal exceeds the threshold, then it is considered that the mobile terminal meets the volume adjustment condition, otherwise, it is considered that the mobile terminal does not meet the volume adjustment condition. In the embodiments of the disclosure, in most examples, if it is determined that the user is doing physical exercise, the volume is to be increased; and if it is determined that the physical exercise information of the user indicates that the state of the user is changed from moving to still, or is changed from strenuous physical exercise to non-strenuous physical exercise, the volume is to be decreased. In other words, it does not mean to exclusively increase the volume.

At block S102, a volume adjustment level corresponding to the physical exercise information is determined, when the mobile terminal meets the preset volume adjustment condition.

The volume adjustment level may be a determined target volume level. For example, if a target volume level is level 7, then volume of the mobile terminal is adjusted to level 7. The volume adjustment level may also be a determined adjustment volume level. For example, if the adjustment volume level is level +2, then the volume level is increased by two levels from a current volume level of the mobile terminal. For example, if the current volume level is level 5, then the volume level is adjusted to level 7 after being increased by two levels.

Regarding determining a volume adjustment level corresponding to the physical exercise information, a mapping table between physical exercise information and volume adjustment levels may be formulated in advance, and this mapping table may be utilized to determine a volume adjustment level after determination of the physical exercise information of the user.

At block S103, a volume of the mobile terminal is adjusted according to the volume adjustment level.

The volume of the mobile terminal is adjusted according to abovementioned determined volume adjustment level. If the volume adjustment level is a target volume level, the volume level of the mobile terminal is adjusted to this target volume level. For example, if the volume adjustment level is level +3, then the volume level of the mobile terminal is increased by three levels. If a difference between the current volume level of the mobile terminal and the highest level of the system is less than three levels, then the volume level of the mobile terminal is directly adjusted to the highest level of the system. Specifically, the volume level may be adjusted in such a way that it is determined whether the adjusted volume level of the mobile terminal is the highest volume level after each one-level adjustment, and if the adjusted volume level is the highest level, then current volume adjustment operation is terminated.

According to the volume adjustment method provided in the embodiments of the disclosure, the physical exercise information of the user is acquired. It is determined whether the mobile terminal meets the preset volume adjustment condition according to the physical exercise information. When the mobile terminal meets the preset volume adjustment condition, a volume adjustment level corresponding to the physical exercise information is determined. A volume of the mobile terminal is adjusted according to the volume adjustment level. By employing the abovementioned solution, an automatic volume adjustment can be performed according to demands of the user.

In some embodiments, the volume adjustment method may further include the operations of determining a frequency adjustment level corresponding to the physical exercise information and adjusting frequency of the sound being played by the mobile terminal according to the frequency adjustment level. The frequency adjustment level may include at least two levels. When physical exercise information of the user is acquired, in addition to automatically adjusting the volume of a music being played, frequency of the music can be adjusted at the same time. For example, if the mobile terminal is currently playing a song, the song can be adjusted to be played at a 1.2-times-speed upon detecting that user is in the physical exercise state and physical exercise intensity has exceeded a certain threshold. Intuitionally, adjusting the play speed of a song is a way for adjusting the frequency. The frequency adjustment level may correspond to a play speed multiplier. Moreover, upon detecting that the user is in the physical exercise state and the physical exercise intensity has exceeded a certain threshold, the mobile terminal may wait until the current piece of music comes to an end and then switch another piece of music with beats at a higher speed, or the mobile terminal may switch to another piece of music with beats at a higher speed before the current piece of music comes to an end. In this case, the speed of the beats in each song in a music library may be acquired and marked before the switching, and then the switching may be performed based on the marks.

The advantage of such a setting is that frequency of the sound being played by the mobile terminal can be adjusted according to the physical exercise state of the user, so as to meet the demands of the user better, and to provide the fun of automatically switching the frequency of the sound being played for the user, thereby improving the user experience.

Figure 2:
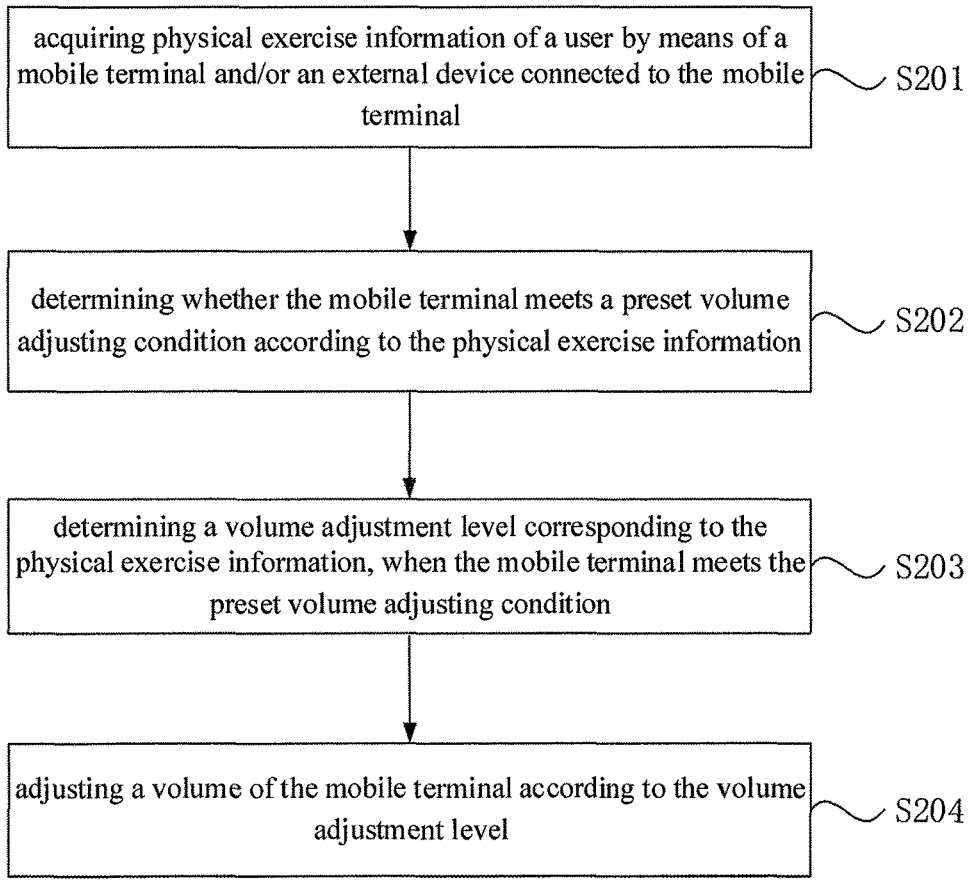
FIG. 2 illustrates a flow chart of another volume adjustment method according to some embodiments of the disclosure.

FIG. 2 illustrates a flow chart of another volume adjustment method according to some embodiments of the disclosure. As illustrated in FIG. 2, the method may include the following operations in blocks illustrated in FIG. 2. The method may begin from block S201.

At block S201, physical exercise information of a user is acquired by means of a mobile terminal and/or an external device connected to the mobile terminal.

The external device may be a smart watch, a smart bracelet or other devices linked externally and can be worn or carried by the user. If an external device is connected to the mobile terminal, it may be determined whether the external device or the mobile terminal is to acquire the physical exercise information of the user according to a setting, or detection may be performed at the external device and the mobile terminal. Upon detecting that the external device is not worn or carried by user, then the method switches to the mobile terminal to acquire the physical exercise information of the user; upon detecting that the external device is worn or carried by user, then the method switches to the external device to acquire the physical exercise information of the user.

In some embodiments, acquiring the physical exercise information of the user by means of the mobile terminal may include: acquiring the physical exercise information of the user by means of one or more acceleration sensors in the mobile terminal; and/or acquiring the physical exercise information of the user with positioning data of the mobile terminal. The acceleration sensor may acquire acceleration information during physical exercise of the user. For example, when the user walks or runs with the mobile terminal handheld, a change of acceleration takes place along with every swing of the arm of the user, and thus the movement frequency of the user can be determined according to a periodical change of the acceleration of the mobile terminal, and the physical exercise state of the user can be determined thereby. Positioning information during physical exercise of the user may be acquired with the positioning data, and the current speed may be calculated according to the positioning information, and the positioning information and the current speed are used together to position the mobile terminal, thereby determining the current physical exercise state of the user. The abovementioned two schemes can be employed simultaneously. For example, when a user is doing physical exercise on a treadmill, the information acquired by the acceleration sensor is the correct information while the positioning data shows that the user is in a still state. In this case, the physical exercise information of the user determined based on a combination of the abovementioned two schemes is more accurate.

In some embodiments, acquiring the physical exercise information of the user by means of an external device connected to the mobile terminal may include: acquiring the physical exercise information of the user by means of an acceleration sensor in the external device connected to the mobile terminal; and/or acquiring biometric information of the user by means of the external device connected to the mobile terminal, and determining the physical exercise information of the user according to the biometric information.

The biometric information may be information of heart rate, blood pressure and shell temperature and so on of the user. The physical exercise intensity of the user can be determined according to the biometric information. For example, if a significant increase in the heart rate of the user is detected, it may be determined that the physical exercise intensity of the user has reached a level of requiring an adjustment of volume level, and the adjustment of volume is performed in subsequent acts. Likewise, the physical exercise information of the user acquired by the acceleration sensor and the biometric information of the user acquired by the external device can be assumed simultaneously, thus improving the accuracy of the determined physical exercise information of the user.

At block S202, it is determined whether the mobile terminal meets a preset volume adjustment condition according to the physical exercise information.

At block S203, a volume adjustment level corresponding to the physical exercise information is determined, when the mobile terminal meets the preset volume adjustment condition.

At block S204, a volume of the mobile terminal is adjusted according to the volume adjustment level.

The embodiments described in view of FIG. 2 provide two specific approaches for acquiring the physical exercise information of the user. According to the embodiments, the accuracy of the determined physical exercise information of the user can be increased, and the adjustment of the volume level of the mobile terminal can reflect the needs of the user more accurately, so that the result of the volume level adjustment is better adapted to the user's habits, thus improving the user experience.

Figure 3:
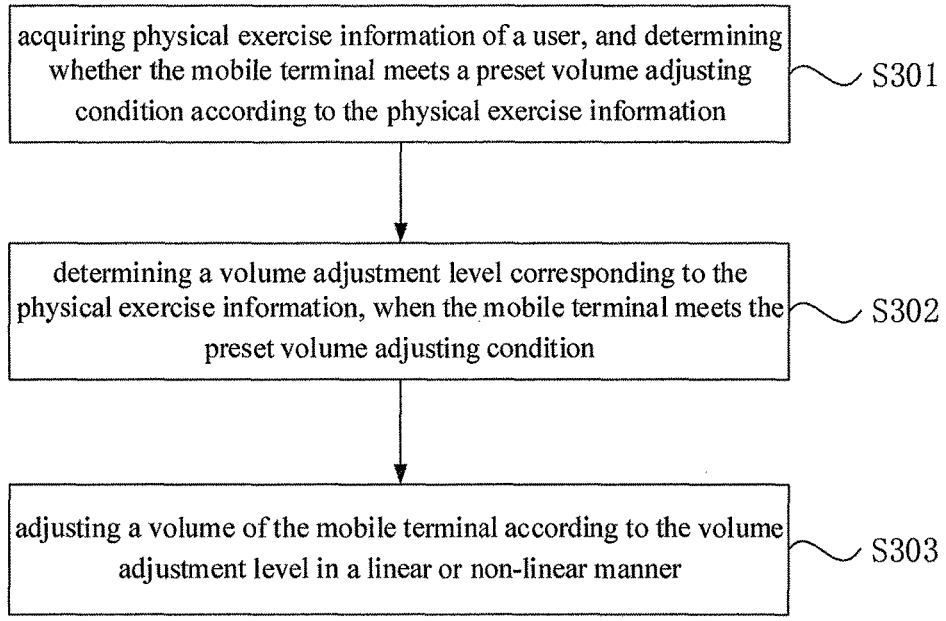
FIG. 3 illustrates a flow chart of yet another volume adjustment method according to some embodiments of the disclosure.

FIG. 3 illustrates a flow chart of yet another volume adjustment method according to some embodiments of the disclosure. As illustrated in FIG. 3, the method may include the following operations in blocks illustrated in FIG. 1. The method may begin from block S101.

At block S301, physical exercise information of a user is acquired, and it is determined whether a mobile terminal meets a preset volume adjustment condition according to the physical exercise information.

At block S302, a volume adjustment level corresponding to the physical exercise information is determined, when the mobile terminal meets the preset volume adjustment condition.

At block S303, a volume of the mobile terminal is adjusted according to the volume adjustment level in a linear or non-linear manner.

In the above method, determining a target volume of volume adjustment is assumed as a manner of determining the volume adjustment level. A difference between the volume adjustment level and a current volume of the mobile terminal may be the corresponding number of the volume levels to be adjusted. For example, the number of the volume levels to be adjusted is preset, such as 3 levels. In this case, if the number of the volume levels to be adjusted is below or equal to 3, the volume of the mobile terminal is adjusted in a linear manner; if the number of the volume levels to be adjusted is above 3, the volume of the mobile terminal is adjusted in a non-linear manner. A linear adjustment manner may be a manner of gradually increasing or gradually decreasing with time, and a non-linear adjustment manner may be a manner of adjusting the volume to a target volume from an original volume through a non-linear change.

On the basis of the above method, a scheme of determining a volume adjustment manner according to the volume adjustment level is proposed. If a difference between a current volume level of the mobile terminal and a target volume level is small, the linear adjustment manner may be directly assumed to adjust the current volume to the target volume. If a difference between a current volume level of the mobile terminal and a target volume level is large, the non-linear adjustment manner is assumed to adjust the current volume to the target volume. This setting has the advantage that a specific volume adjustment manner can be determined according to a comparison of the difference and the preset level difference, the non-linear adjustment process during the volume adjustment can be highlighted in the case that the difference is large, thereby more effectively drawing the attention of the user and improving the comfort of automatic volume adjustment.

In some embodiments, the non-linear adjustment manner may include a concave-function-style incrementing/decrementing manner, a convex-function-style incrementing/decrementing manner, and a firstly increasing-then decreasing-finally gradually increasing/firstly decreasing-then increasing-finally gradually decreasing manner.

Figure 4:
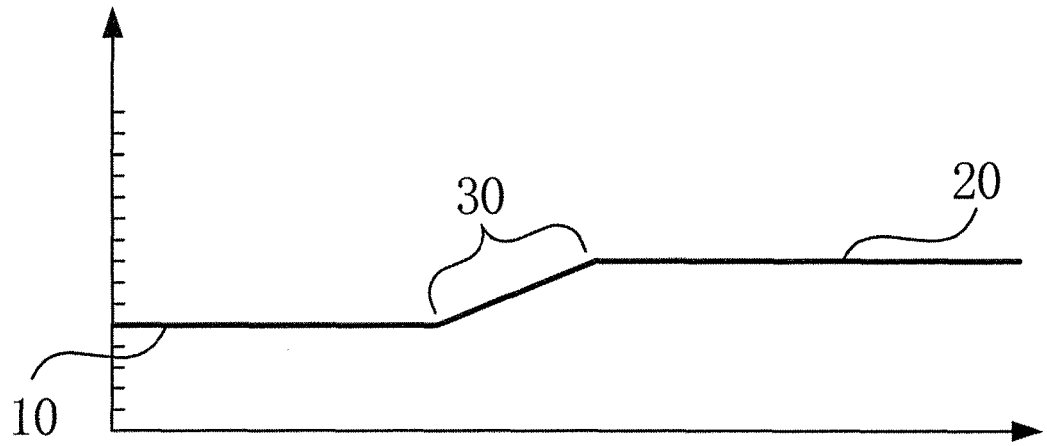
FIG. 4 illustrates a schematic diagram of a linear volume adjustment manner according to some embodiments of the disclosure.

FIG. 4 illustrates a schematic diagram of a linear volume adjustment method according to some embodiments of the disclosure. As illustrated in FIG. 4, the horizontal axis may represent time, and the vertical axis may represent volume level. When a difference between a current volume level 10 of the mobile terminal and a target volume level 20 is small and is below or equal to a preset level difference, the linear adjustment manner is assumed, so that linear adjustment 30 is assumed between the current volume level 10 and the target volume level 20.

Figure 5A:
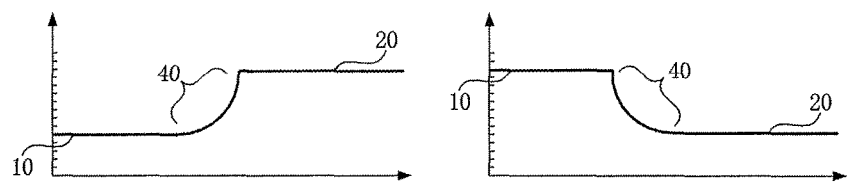
FIG. 5a illustrates a schematic diagram of a volume non-linear adjusting approach according to some embodiments of the disclosure.

FIG. 5a illustrates a schematic diagram of a non-linear volume adjustment manner according to some embodiments of the disclosure. As illustrated in FIG. 5a, the horizontal axis may represent time, and the vertical axis may represent volume level. When a difference between a current volume level 10 of the mobile terminal and a target volume level 20 is large and is above a preset level difference, a non-linear adjustment manner is assumed. There are two cases, i.e., the current volume level 10 is larger than the target volume level 20, and the current volume level 10 is less than the target volume level 20. FIG. 5a illustrates performing volume adjustment in a concave-function-style incrementing/decrementing manner.

Figure 5B:
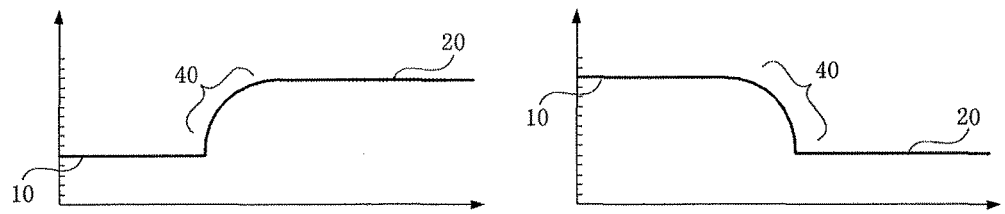
FIG. 5b illustrates a schematic diagram of another volume non-linear adjusting approach according to some embodiments of the disclosure.

FIG. 5b illustrates a schematic diagram of another non-linear volume adjustment manner according to some embodiments of the disclosure, As illustrated in FIG. 5b, the horizontal axis may represent time, and the vertical axis may represent volume level. When a difference between a current volume level 10 of the mobile terminal and a target volume level 20 is large and is above a preset level difference, a non-linear adjustment manner is assumed. There are two cases, i.e., the current volume level 10 is larger than the target volume level 20 and the current volume level 10 is less than the target volume level 20. FIG. 5b illustrates performing volume adjustment in a convex-function-style incrementing/decrementing manner.

Figure 5C:
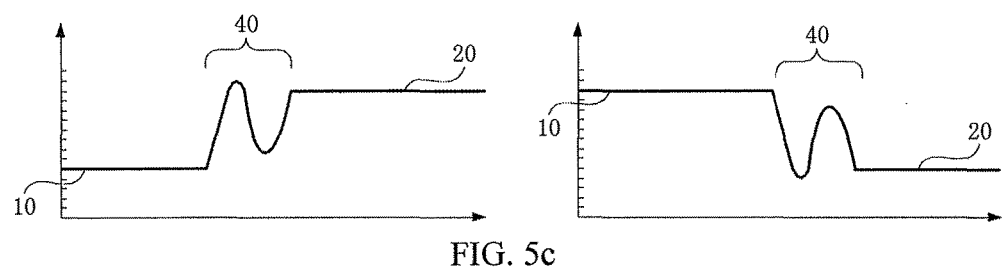
FIG. 5c illustrates a schematic diagram of yet another volume non-linear adjusting approach according to some embodiments of the disclosure.

FIG. 5c illustrates a schematic diagram of yet another non-linear volume adjustment manner according to some embodiments of the disclosure. As illustrated in FIG. 5c, the horizontal axis may represent time, and the vertical axis may represent volume level. When a difference between a current volume level 10 of the mobile terminal and a target volume level 20 is large and is above a preset level difference, a non-linear adjustment manner is assumed. There are two cases, i.e., the current volume level 10 is larger than the target volume level 20 and the current volume level 10 is less than the target volume level 20. FIG. 5c illustrates performing volume adjustment in an increasing-decreasing-gradually increasing/decreasing-increasing-gradually decreasing manner.

As described above, a specific approach of linear adjustment and non-linear volume adjustment is provided. The linear adjustment is merely described for the case that a target volume is larger than the current volume, and it is also applicable for both of the case that the target volume is less than the current volume or the target volume is equal to the current volume. In the case that the target volume is equal to the current volume, it appears that no adjustment is needed.

The abovementioned solutions of adjusting a volume level in a non-linear manner may implement a variable-speed volume adjustment. Not only volume adjustment can be performed according to the demands of the user, but also the attention of the user during the volume adjustment can be drawn by rendering the process of volume adjustment, such that the user can enjoy a fun of volume adjustment.

Figure 6:
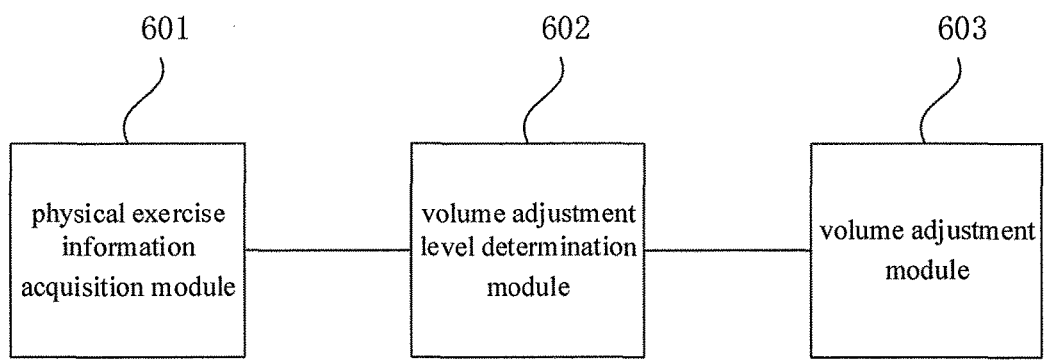
FIG. 6 illustrates a structural block diagram of a volume adjustment device according to some embodiments of the disclosure.

FIG. 6 illustrates a structural block diagram of a volume adjustment device according to some embodiments of the disclosure. The device can be implemented as software and/or hardware and is generally integrated in the mobile terminal. The device can adjust a volume of the mobile terminal by performing a volume adjustment method. As illustrated in FIG. 6, the device may include a physical exercise information acquisition module 601, a volume adjustment level determination module 602, and a volume adjustment module 603.

The physical exercise information acquisition module 601 is configured to acquire physical exercise information of the user and determine whether the mobile terminal meets a preset volume adjustment condition according to the physical exercise information.

The volume adjustment level determination module 602 is configured to determine a volume adjustment level corresponding to the physical exercise information, when the mobile terminal meets the preset volume adjustment condition.

The volume adjustment module 603 is configured to adjust the volume of the mobile terminal according to the volume adjustment level.

According to the volume adjustment device provided by some embodiments of the disclosure, the physical exercise information acquisition module acquires the physical exercise information of the user and determines whether the mobile terminal meets a preset volume adjustment condition according to the physical exercise information, the volume adjustment level determination module determines a volume adjustment level corresponding to the physical exercise information, when the mobile terminal meets the preset volume adjustment condition, and the volume adjustment module adjusts the volume of the mobile terminal according to the volume adjustment level. By means of the above solution, an effect of automatically adjusting the volume according to the demands of the user can be implemented.

In some embodiments, the device may further include a frequency adjusting module, configured to determine a frequency adjustment level corresponding to the physical exercise information and adjust frequency of the sound being played by the mobile terminal according to the frequency adjustment level.

In some embodiments, the physical exercise information acquisition module 601 may include at least one of a mobile terminal physical exercise information acquisition unit or an external device physical exercise information acquisition unit.

The mobile terminal physical exercise information acquisition unit may be configured to acquire the physical exercise information of the user by means of the mobile terminal.

The external device physical exercise information acquisition unit may be configured to acquire the physical exercise information of the user by means of an external device connected to the mobile terminal.

In some embodiments, the mobile terminal physical exercise information acquisition unit may include at least one of a first acceleration acquisition unit or a positioning data acquisition unit.

The first acceleration acquisition unit may be configured to acquire the physical exercise information of the user by means of one or more acceleration sensors in the mobile terminal.

The positioning data acquisition unit may be configured to acquire the physical exercise information of the user by means of positioning data from the mobile terminal.

In some embodiments, the external device physical exercise information acquisition unit may include at least one of a second acceleration acquisition unit or a biometric information acquisition unit.

The second acceleration acquisition unit may be configured to acquire the physical exercise information of the user by means of one or more acceleration sensors in the external device connected to the mobile terminal.

The biometric information acquisition unit may be configured to acquire biometric information of the user by means of the external device connected to the mobile terminal, and determine the physical exercise information of the user according to the biometric information.

In some embodiments, the volume adjustment module 603 may include at least one of a linear adjusting unit or a non-linear adjusting unit.

The linear adjusting unit may be configured to adjust the volume of the mobile terminal according to the volume adjustment level in a linear manner.

The non-linear adjusting unit may be configured to adjust the volume of the mobile terminal according to the volume adjustment level in a non-linear manner.

In some embodiments, the volume adjustment module 603 may further include a difference acquisition unit, a first adjustment manner determination unit, and a second adjustment manner determination unit.

The difference acquisition unit may be configured to acquire a difference between the volume adjustment level and a current volume level of the mobile terminal.

The first adjustment manner determination unit may be configured to adjust the volume in the linear adjustment manner, when the difference is less than a preset level difference.

The second adjustment manner determination unit may be configured to adjust the volume in the non-linear adjustment manner, when the difference is no less than the preset level difference.

A storage medium is a memory device or a storage device of any type. The term "storage medium" is intended to include: installation media, for example CD-ROM, floppy disk or tape device; computer system memory or random access memory, such as DRAM, DDR RAM, SRAM, EDO RAM, Rambus RAM, and etc.; non-volatile memory, such as flash memory, magnetic media (for example hard disk or optical storage); register or other memory elements of similar types, etc. A storage medium may further include memories of other types or a combination thereof. Moreover, a storage medium may be located in a first computer system in which a program is executed, or may be located in a distinct second computer system connected to the first computer system over a network (such as internet). The second computer system can provide program instructions to the first computer system for executing. The term "storage medium" may include two or more storage mediums located in different positions (for example in different computer systems linked by network). A storage medium can store program instructions (for example, specifically implemented as computer programs) executed by at least one processor.

Certainly, some embodiments of the disclosure provides a storage medium containing computer-executable instructions, the computer-executable instructions are not limited to the abovementioned volume adjustment operations, but can also perform relevant operations in the volume adjustment method according to any embodiment of the disclosure.

Figure 7:
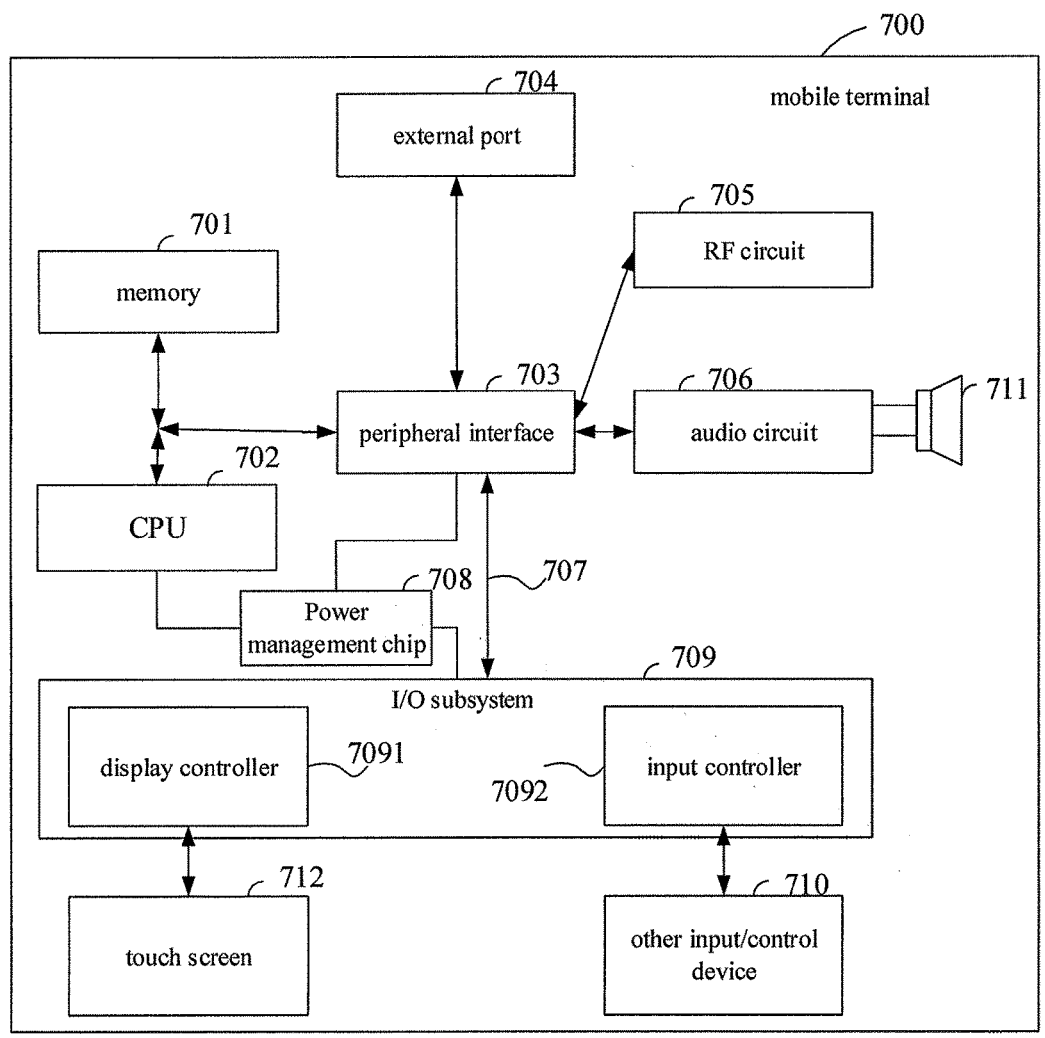
FIG. 7 illustrates a structural schematic diagram of a mobile terminal according to some embodiments of the disclosure.

Some embodiments of the disclosure proposed a mobile terminal. The volume adjustment device according to some embodiments of the disclosure may be integrated in the mobile terminal. FIG. 7 illustrates a structural schematic diagram of the mobile terminal according to some embodiments of the disclosure. As illustrated in FIG. 7, the mobile terminal may include a memory 701, a Central Processing Unit (CPU, also called processor, referred to as CPU hereafter) 702, a circuit board (not illustrated), and a power supply circuit (not illustrated). The circuit board is arranged inside the space enclosed by a casing. The CPU 702 and the memory 701 are arranged on the circuit board. The power supply circuit is configured to power various circuits or elements of the mobile terminal. The memory 701 is configured to store executable program codes. The CPU 702 executes computer programs corresponding to the executable program codes by reading the executable program codes stored in the memory 701, so as to implement the following acts: acquiring physical exercise information of a user, and determining whether the mobile terminal meets a preset volume adjustment condition according to the physical exercise information; determining a volume adjustment level corresponding to the physical exercise information, when the mobile terminal meets the preset volume adjustment condition; adjusting a volume of the mobile terminal according to the volume adjustment level.

The mobile terminal may further include a peripheral interface 703, a RF (Radio Frequency) circuit 705, an audio circuit 706, a loudspeaker 711, a power management chip 708, an input/output (I/O) subsystem 709, a touch screen 712, other input/control devices 710 and an external port 704. All these components communicate through at least one communication bus or signal line 707.

It is to be understood that, the mobile terminal 700 as illustrated is an example of a mobile terminal, and the mobile terminal 700 may have more or less components than those illustrated in figure, may combine two or more components, or may have different components arrangements. Various components illustrated in figure can be implemented as hardware including at least one signal processing circuit and/or application specific integrated circuit, software, or a combination of hardware and software.

The mobile terminal according to the present embodiment will be described in detail below. The mobile terminal may be, for example, a mobile phone.

The memory 701 can be accessed by the CPU 702, the peripheral interface 703, and etc. The memory 701 may include a high-speed random access memory, and may further include a non-volatile memory, for example at least one disk storage, flash memory, or other non-volatile solid-state storage device.

The peripheral interface 703 can connect input and output peripheral devices of the mobile terminal to the CPU 702 and the memory 701.

The I/O subsystem 709 can connect the input and output peripheral devices of the mobile terminal, for example the touch screen 712 and other input/control devices 710, to the peripheral interface 703. The I/O subsystem 709 may include a display controller 7091 and at least one input controller 7092 for controlling other input/control devices 710. The at least one input controller 7092 receives electrical signals from other input/control devices 710 or sends electrical signals to other input/control devices 710. The other input/control devices 710 may include physical buttons (press buttons, rocker buttons, etc.), dial panel, slide switch, joystick, click wheel. It is to be noted that the input controller 7092 can be connected with any one of a keyboard, an infrared port, a USB interface, or a pointing device such as a mouse.

The touch screen 712 is an input interface and an output interface between the mobile terminal and the user. The touch screen 712 displays visual output for the user, and the visual output may include graphic, text, icon, video, and etc.

The display controller 7091 in the I/O subsystem 709 receives electrical signals from the touch screen 712 or sends electrical signals to the touch screen 712. The touch screen 712 detects a touch on the touch screen, the display controller 7091 converts the detected touch into interaction with a user interface object displayed on the touch screen 712, i.e. to implement human-computer interaction. The user interface object displayed on the touch screen 712 may be an icon for running a game, an icon for networking to a corresponding network, and etc. It is to be noted that, the device may further include an optical mouse, which is a touch-sensitive surface without displaying visual output, or an extension of a touch-sensitive surface formed by the touch screen.

The RF circuit 705 is mainly configured to establish communication between a mobile phone and a wireless network (i.e. the network side), and to implement data reception and transmission between the mobile phone and the wireless network, for example, to receive or send messages, emails, etc. Specifically, the RF circuit 705 receives and transmits RF signals (also called electromagnetic signals), the RF circuit 705 converts electrical signals into electromagnetic signals or converts electromagnetic signals into electrical signals, and communicates with a communication network or other devices by means of these electromagnetic signals. The RF circuit 705 may include known circuits listed below for performing these functions, including but not limited to: an antenna system, an RF transceiver, at least one amplifier, a tuner, at least one oscillator, a digital signal processor, a coder-decoder (CODEC) chipset, a subscriber identity module (SIM), and etc.

The audio circuit 706 is mainly configured to receive audio data from the peripheral interface 703, convert the audio data into electrical signals, and transmit the electrical signals to the loudspeaker 711.

The loudspeaker 711 is configured to restore voice signals received from the wireless network by the mobile phone by means of the RF circuit into sound and to play the sound to the user.

The power management chip 708 is configured to power the CPU 702, the I/O subsystem 709 and hardware connected with the peripheral interface, and perform power management.

The mobile terminal according to some embodiments of the disclosure can implement automatic volume adjustment according to demands of the user.

The volume adjustment device, the storage medium and the mobile terminal provided in the abovementioned embodiments can perform the volume adjustment method provided in any embodiment of the disclosure, and have functional modules for performing the method and can achieve advantageous effects corresponding to those of the method. Technical details not described in the abovementioned device embodiments may be seen from the volume adjustment methods proposed in the method embodiments of the disclosure.

It is to be noted that merely some embodiments and operating technical principles are described above. It is to be understood by those person skilled in the art that, the disclosure is not limited to the specific embodiments herein, various significant modifications, readjustments and alternatives can be made by those person skilled in the art without departing from the scope of the disclosure. Therefore, although the disclosure has been described in detail with reference to the abovementioned embodiments, the disclosure is not limited to the abovementioned embodiments. Other equivalent embodiments may also be incorporated without departing from the concept of the disclosure, and the scope of the disclosure is defined by appended claims.

The invention claimed is:

1. A volume adjustment method, executed by a mobile terminal, the method comprising:
   acquiring physical exercise information of a user;
   determining whether the mobile terminal meets a preset volume adjustment condition according to the physical exercise information;
   determining a volume adjustment level corresponding to the physical exercise information, when the mobile terminal meets the preset volume adjustment condition;
   acquiring a difference between the volume adjustment level and a current volume level of the mobile terminal;
   adjusting a volume of the mobile terminal in a linear manner, when the difference is less than a preset level difference; and
   adjusting the volume in a non-linear manner, when the difference is equal to or greater than the preset level difference, wherein the non-linear manner comprises one of a concave-function-style incrementing or decrementing manner, a convex-function-style incrementing or decrementing manner, and a firstly increasing-then decreasing-finally gradually increasing or firstly decreasing-then increasing-finally gradually decreasing manner.

2. The method of claim 1, further comprising:
   determining a frequency adjustment level corresponding to the physical exercise information; and
   adjusting frequency of a sound being played by the mobile terminal according to the frequency adjustment level.

3. The method of claim 1, further comprising:
   determining a frequency adjustment level corresponding to the physical exercise information; and
   switching from the sound being played to a piece of music, of which beats are at a speed matched with the frequency adjustment level.

4. The method of claim 1, wherein the physical exercise information comprises at least one of the following: physical exercise intensity, physical exercise duration, movement speed or frequency, or estimated energy consumed by physical exercise.

5. The method of claim 1, wherein acquiring physical exercise information of a user comprises at least one of the following:
   acquiring the physical exercise information of the user by means of one or more acceleration sensors in at least one of the mobile terminal or an external device connected to the mobile terminal;
   acquiring the physical exercise information of the user by means of positioning data from at least one of the mobile terminal or the external device connected to the mobile terminal; or
   acquiring biometric information of the user by means of at least one of the mobile terminal or the external device connected to the mobile terminal, and determining the physical exercise information of the user according to the biometric information.

6. A non-transitory computer-readable storage medium, storing a computer program, which, when executed by a processor, implements a volume adjustment method, the method comprising:
   acquiring physical exercise information of a user;
   determining whether a mobile terminal meets a preset volume adjustment condition according to the physical exercise information;
   determining a volume adjustment level corresponding to the physical exercise information, when the mobile terminal meets the preset volume adjustment condition;
   acquiring a difference between the volume adjustment level and a current volume level of the mobile terminal;
   adjusting a volume of the mobile terminal in a linear manner, when the difference is less than a preset level difference; and
   adjusting the volume in a non-linear manner, when the difference is equal to or greater than the preset level difference, wherein the non-linear manner comprises one of a concave-function-style incrementing or decrementing manner, a convex-function-style incrementing or decrementing manner, and a firstly increasing-then decreasing-finally gradually increasing or firstly decreasing-then increasing-finally gradually decreasing manner.

7. The non-transitory computer-readable storage medium of claim 6, wherein the method further comprises:
   determining a frequency adjustment level corresponding to the physical exercise information; and
   adjusting frequency of a sound being played by the mobile terminal according to the frequency adjustment level, or switching from the sound being played to a piece of music, of which beats are at a speed matched with the frequency adjustment level.

8. The non-transitory computer-readable storage medium of claim 6, wherein the physical exercise information comprises at least one of the following: physical exercise intensity, physical exercise duration, movement speed or frequency, or estimated energy consumed by physical exercise.

9. The non-transitory computer-readable storage medium of claim 6, wherein acquiring physical exercise information of a user comprises at least one of the following:
   acquiring the physical exercise information of the user by means of one or more acceleration sensors in at least one of the mobile terminal or an external device connected to the mobile terminal;
   acquiring the physical exercise information of the user by means of positioning data from at least one of the mobile terminal or the external device connected to the mobile terminal; or
   acquiring biometric information of the user by means of at least one of the mobile terminal or the external device connected to the mobile terminal, and determining the physical exercise information of the user according to the biometric information.

10. A mobile terminal, comprising:
    a processor; and
    a memory storing computer program, which, when executed by a processor, implements a volume adjustment method, the method comprising:
    acquiring physical exercise information of a user;
    determining whether the mobile terminal meets a preset volume adjustment condition according to the physical exercise information;
    determining a volume adjustment level corresponding to the physical exercise information, when the mobile terminal meets the preset volume adjustment condition;
    acquiring a difference between the volume adjustment level and a current volume level of the mobile terminal;
    adjusting a volume of the mobile terminal in a linear manner, when the difference is less than a preset level difference; and adjusting the volume in a non-linear manner, when the difference is equal to or greater than the preset level difference, wherein the non-linear manner comprises one of a concave-function-style incrementing or decrementing manner, a convex-function-style incrementing or decrementing manner, and a firstly increasing-then decreasing-finally gradually increasing or firstly decreasing-then increasing-finally gradually decreasing manner.

11. The mobile terminal of claim 10, wherein the method further comprises:
   determining a frequency adjustment level corresponding to the physical exercise information; and
   adjusting frequency of a sound being played by the mobile terminal according to the frequency adjustment level.

12. The mobile terminal of claim 10, wherein the method further comprises:
   determining a frequency adjustment level corresponding to the physical exercise information; and
   switching from the sound being played to a piece of music, of which beats are at a speed matched with the frequency adjustment level.

13. The mobile terminal of claim 10, wherein the physical exercise information comprises at least one of the following: physical exercise intensity, physical exercise duration, movement speed or frequency, or estimated energy consumed by physical exercise.

14. The mobile terminal of claim 10, wherein acquiring physical exercise information of a user comprises at least one of the following:
   acquiring the physical exercise information of the user by means of one or more acceleration sensors in at least one of the mobile terminal or an external device connected to the mobile terminal;
   acquiring the physical exercise information of the user by means of positioning data from at least one of the mobile terminal or the external device connected to the mobile terminal; or
   acquiring biometric information of the user by means of at least one of the mobile terminal or the external device connected to the mobile terminal, and determining the physical exercise information of the user according to the biometric information.

* * * * *